(12) United States Patent
Meltzer et al.

(10) Patent No.: US 7,792,514 B2
(45) Date of Patent: Sep. 7, 2010

(54) ENVELOPE DETECTOR FOR AM RADIO

(75) Inventors: David Meltzer, Wappinger Falls, NY (US); Gregory Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 601 days.

(21) Appl. No.: 11/760,227

(22) Filed: Jun. 8, 2007

(65) Prior Publication Data

US 2008/0305760 A1    Dec. 11, 2008

(51) Int. Cl.
    H04B 1/16    (2006.01)
(52) U.S. Cl. .............. 455/334; 455/127.4; 375/320
(58) Field of Classification Search .............. 455/127.1, 455/127.2, 127.4, 334, 355; 375/317, 320, 375/346
    See application file for complete search history.

(56) References Cited

U.S. PATENT DOCUMENTS

| | | | |
|---|---|---|---|
| 3,947,769 A | | 3/1976 | Rousos et al. |
| 4,722,009 A | * | 1/1988 | Nakama et al. ............... 360/8 |
| 6,565,001 B1 | | 5/2003 | Schoenbauer |
| 6,903,600 B2 | | 6/2005 | Blodgett |
| 7,068,725 B2 | | 6/2006 | Roth et al. |
| 7,109,466 B2 | | 9/2006 | Park et al. |
| 2002/0022493 A1 | * | 2/2002 | Elliot ......................... 455/506 |
| 2004/0071225 A1 | * | 4/2004 | Suzuki et al. ............... 375/297 |
| 2004/0189393 A1 | | 9/2004 | Nguyen et al. |
| 2005/0162298 A1 | * | 7/2005 | Kuzumoto ................... 341/155 |
| 2009/0232260 A1 | * | 9/2009 | Hayashi et al. ............. 375/346 |

FOREIGN PATENT DOCUMENTS

| | | |
|---|---|---|
| JP | 09219628 | 8/1997 |
| JP | 11-088449 | 3/1999 |
| JP | 2002-111602 | 4/2002 |

* cited by examiner

*Primary Examiner*—Nhan Le

(57) ABSTRACT

A receiver for receiving an amplitude modulated (AM) signal may include a first and a second detector for detecting the maximum and minimum envelope values, respectively, of the received AM signal and an equalizer for periodically equalizing the maximum and minimum envelope values. A method for receiving an AM signal may include unidirectionally increasing a first output signal up to the maximum envelope value, unidirectionally decreasing a second output signal down to the minimum envelope value, and periodically equalizing the first and the second output signals.

29 Claims, 10 Drawing Sheets

FIG. 1
(Conventional)
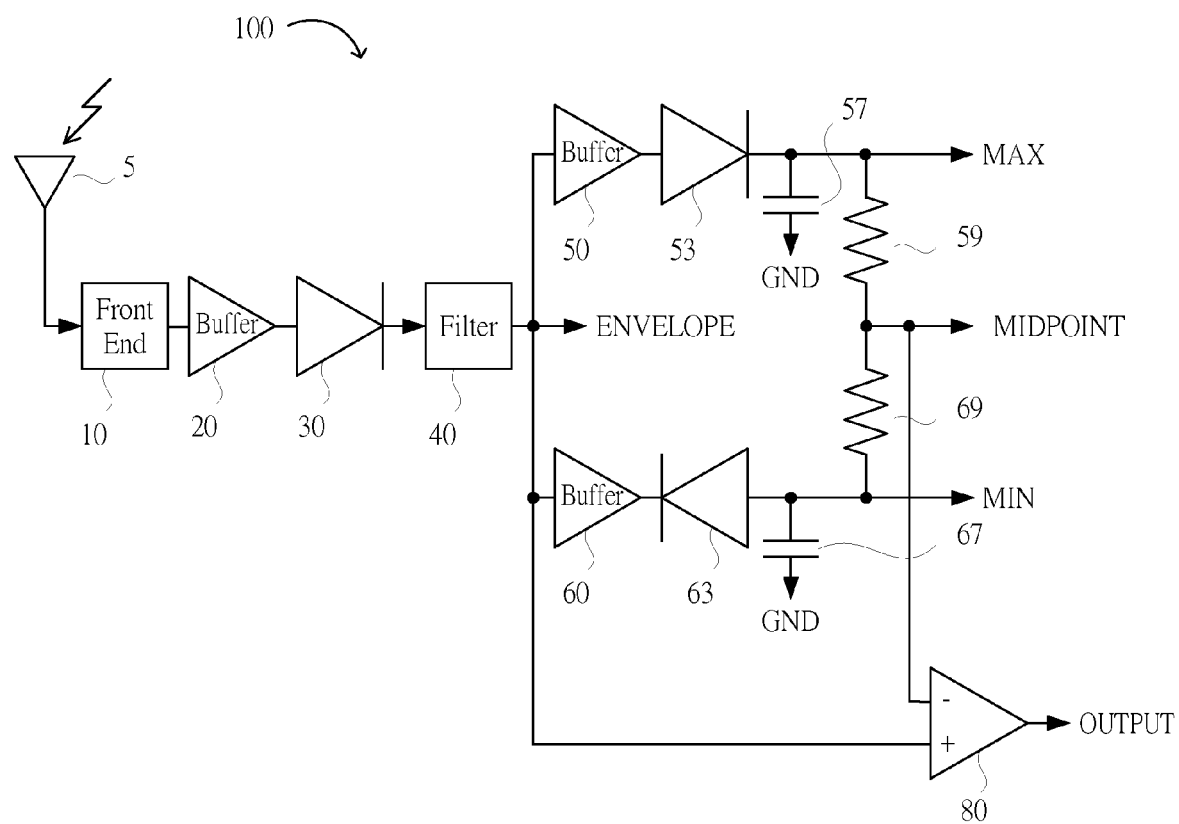

FIG. 2A
(Conventional)
FIG. 2B
(Conventional)
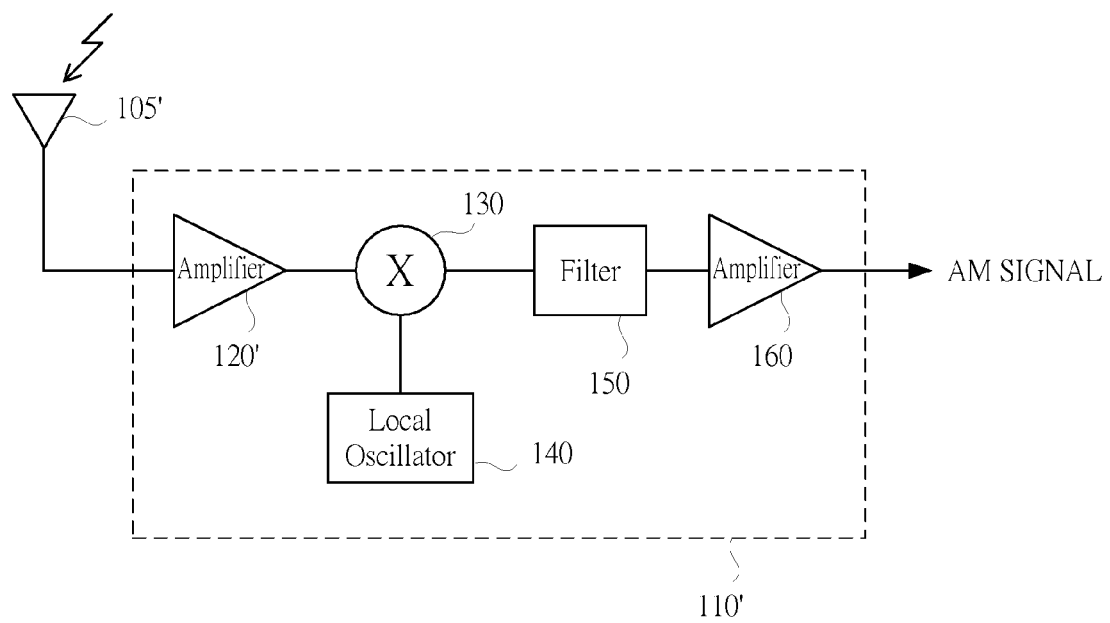

ENVELOPE DETECTOR FOR AM RADIO

FIELD OF THE INVENTION

The present invention generally relates to the field of AM radio receivers. More specifically, embodiments of the present invention pertain to receivers and methods of receiving an amplitude modulated radio signal by detecting the peak maximum and the peak minimum of the signal envelope.

DISCUSSION OF THE BACKGROUND

There are several well known techniques for receiving amplitude modulated (AM) signals, and in particular, signals modulated by amplitude shift keying a carrier signal. In such AM signals, variations in the magnitude represent digital data, the digital data of which may represent information to be transmitted. Amplitude modulation of digital data is used in a variety of applications including, but not limited to: pagers, radio watches, radio frequency identification (RFID) tags, fiber optics, and cable modems.

One well known technique for detecting the signal envelope of an AM signal is shown in FIG. 1. A conventional envelope detector 100 may include one or more diodes configured to rectify the AM signal (i.e., diode-based signal envelope detection). Antenna 5 is configured to receive a low frequency broadcast AM signal. For radio clock/watch applications, the frequency of the broadcast AM signal is typically between 40 kHz to 100 kHz. The antenna 5 is coupled to a front end 10 which may be configured to amplify the broadcast AM signal. In addition, front end 10 may also be configured to convert the broadcast AM signal to an intermediate frequency in a heterodyne receiver architecture.

FIG. 2A shows a conventional front end 110 suitable for direct conversion radio receivers (i.e., where the broadcast AM signal is directly converted to a baseband signal). Front end 110 includes an amplifier 120 configured to produce an amplified version of the broadcast AM signal received by antenna 105. Alternatively, and as shown in FIG. 2B, conventional front end 110' is configured for heterodyne reception (i.e., where the broadcast AM signal is converted to an intermediate frequency before subsequent conversation to a baseband signal). Front end 110' includes a first amplifier 120' configured to amplify the broadcast AM signal and provide a first input to a mixer 130. A local oscillator 140 provides a second input to mixer 130. Mixer 130 generally combines the two input signals (i.e., multiplies the amplified broadcast AM signal by the output signal of the local oscillator 140) and provides an input to a filter 150. Filter 150 generally filters one or more spectral components of the output signal of mixer 130. A second amplifier 160 receives the filtered signal and provides an intermediate frequency output signal.

Referring back to FIG. 1, the conventional envelope detector 100 includes a buffer 20 for isolating the front end 10 from subsequent circuitry. Diode 30 provides a rectified version of the output signal of buffer 30 to filter 40. Filter 40 receives the rectified output signal of front end 10. In one example, filter 40 can be a low pass filter with a cutoff frequency less than the carrier frequency and greater than the maximum envelope frequency of the AM signal. The output signal ENVELOPE of filter 40 is a voltage shifted version (i.e., non-zero DC value) of the envelope of the AM signal.

Buffer 50, diode 53, and capacitor 57 may form a peak maximum detector. Similarly, buffer 60, diode 63, and capacitor 67 form a peak minimum detector. Capacitor 57 can be charged to a voltage signal MAX representative of the peak maximum of signal ENVELOPE, and capacitor 67 can charged to a voltage signal MIN representative of the peak minimum of signal ENVELOPE. A resistor divider circuit, which includes resistor 59 and resistor 69, produces a midpoint voltage signal MIDPOINT which is approximately equal to the average of the voltage signals MAX and MIN. The capacitance value of capacitor 57 and the resistance value of resistor 59 must be selected such that the time constant of the RC circuit formed by capacitor 57 and resistor 59 is much less than the minimum frequency of the envelope of the AM signal. Similarly, the capacitance value of capacitor 67 and resistance value of resistor 69 must be selected such that the time constant of the RC circuit is much less than the minimum frequency of the envelope of the AM signal. Differential amplifier 80 can be configured to subtract the midpoint voltage MIDPOINT from the signal ENVELOPE to produce a signal OUTPUT representative of the envelope of the AM signal having a near-zero DC offset.

The output of the conventional envelope detector 100 continuously, and nearly linearly, follows the envelope of the AM signal. In addition, the conventional envelope detector is generally considered to be a simple and low cost solution because it uses passive components, such as diodes 30, 53 and 63, resistors 59 and 69, and capacitors 57 and 67. The conventional envelope detector 100 is generally useful in applications that receive analog-modulated AM signals (i.e., audio receivers).

However, many low-power portable applications receive digitally-modulated AM signals (i.e., radio clocks/watches and pagers) where the detected envelope signal may require subsequent processing to recover the modulated digital signal. The subsequent processing can be achieved by the use of low voltage digital components (e.g., low voltage CMOS microprocessors, microcontrollers, and/or transistors). Modern low voltage CMOS technologies can operate on supply voltages of 1.0 V or less and have typical CMOS transistor thresholds of 0.4 V. But since the voltage drop across a silicon diode (e.g., diode 30 of the conventional envelope detector 100 as shown in FIG. 1) is typically 0.6 V, little or no signal will be received by a typical CMOS transistor. This is because a 1.0 V maximum received signal (i.e., the supply voltage maximum) less 0.6 V typical drop across a silicon diode will have a 0.4 V maximum amplitude at the input to the CMOS transistor (which is or is close to a typical CMOS transistor threshold).

Therefore, a need exists for a low cost envelope detector, operable using very low supply voltages, which is compatible with modern low voltage CMOS technologies.

SUMMARY OF THE INVENTION

Embodiments of the present invention relate to receivers and methods of receiving amplitude modulated (AM) signals. Specifically, a receiver and method of receiving an AM signal can include detecting the peak maximum and the peak minimum of the AM signal envelope using one or more sources to unidirectionally increase a first output signal value to the minimum value of the AM signal envelope and/or decrease a second output signal value to the maximum value of the AM signal envelope.

In one aspect, the invention concerns a receiver for receiving an amplitude modulated (AM) signal, which includes: a first detector configured to receive the AM signal and decrease an amplitude of a first output signal when an amplitude of the AM signal is less than or about equal to the amplitude of the first output signal; a second detector configured to receive the AM signal and increase an amplitude of a second output signal when the amplitude of the AM signal is greater than or about equal to the amplitude of the second output signal; and an equalizer configured to produce one or more equalization signals for periodically equalizing the amplitude of the first output signal and the amplitude of the second output signal.

In another aspect, the invention concerns a method of receiving an amplitude modulated (AM) signal, which includes: decreasing an amplitude of a first output signal when an amplitude of the AM signal is less than the amplitude of the first output signal; increasing an amplitude of a second output signal when the amplitude of the AM signal is greater than the amplitude of the second output signal; and periodically and simultaneously decreasing the amplitude of the first output signal and increasing the amplitude of the second output signal.

In yet another aspect, the invention concerns a method of detecting a peak amplitude of an amplitude modulated (AM) signal, which includes: producing an output signal having a first amplitude; characterizing an amplitude of the AM signal as having a value relative to the first amplitude of the output signal; and monotonically adjusting the output signal to have a second amplitude, wherein a difference between the second amplitude of the output signal and the amplitude of the AM signal is less than a difference between the first amplitude of the output signal and the amplitude of the AM signal.

The present invention advantageously provides an economical and efficient approach to envelope detection of AM signals operable at very low supply voltages. In particular, a receiver can provide the advantages of the conventional diode-based envelope detector without the use of a diode for signal rectification.

These and other advantages of the present invention will become readily apparent from the detailed description of preferred embodiments below.

BRIEF DESCRIPTION OF THE DRAWINGS

FIG. 1 is a diagram showing a conventional envelope detector.

FIGS. 2A-2B are diagrams showing examples of conventional front end processors.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For convenience and simplicity, the terms "data," "signal," and "signals" may be used interchangeably, as may the terms "connected to," "coupled with," "coupled to," and "in communication with" (which terms also refer to direct and/or indirect relationships between the connected, coupled and/or communication elements unless the context of the terms use unambiguously indicates otherwise), but these terms are also generally given their art-recognized meanings. Also, for convenience and simplicity, the terms "computing," "calculating," "determining," "processing," "manipulating," "transforming," "operating," and "setting" (or the like) may be used interchangeably, and generally refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture. Similarly, the terms "combined," "summed," "mixed" and the like can be used interchangeably but are generally given their art-recognized meanings.

The invention, in its various aspects, will be explained in greater detail below with regard to exemplary embodiments.

An Exemplary Receiver for Receiving an Amplitude Modulated Signal

Figure 3A:
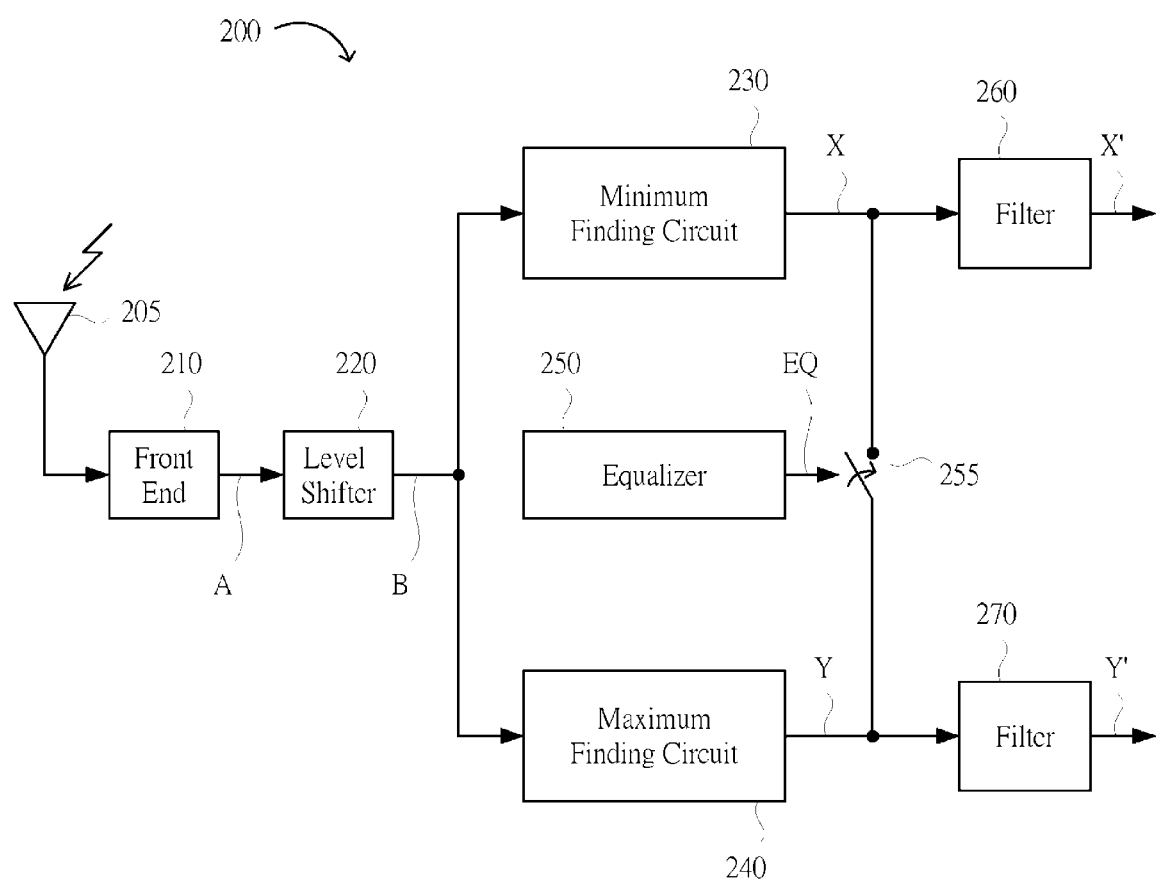
FIGS. 3A-3B are diagrams showing implementations of an envelope detector in accordance with the present invention.

In one embodiment, a receiver for receiving an amplitude modulated (AM) signal includes first and second peak detectors configured to detect and output a minimum and a maximum of the received AM signal, respectively, and an equalizer configured to equalize the amplitudes of the peak detector output signals. Referring now to FIG. 3A, a receiver 200 can include antenna 205 configured to receive a low frequency broadcast AM signal. Antenna 205 may be coupled to a front end 210 which may be configured to amplify the broadcast AM signal. Front end 210 may be the same as or similar to that of the conventional front end 110 or 110' (as shown in FIGS. 2A and 2B). Thus, in one example, front end 210 may also be configured to convert the broadcast AM signal to an intermediate frequency. In one implementation, the receiver may include a level shifter 220 configured to adjust an average value of the AM signal. Level shifter 220 may be configured to receive a zero DC offset AM signal (e.g., signal A) and produce a non-zero DC offset, or level-shifted, AM signal (e.g., signal B).

The receiver 200 can include a minimum finding circuit 230 (i.e., the first peak detector) and a maximum finding circuit 240 (i.e., the second peak detector), each configured to receive the level-shifted AM signal (e.g., signal B). Minimum finding circuit 230 may be configured to decrease an amplitude of a first output signal (e.g., signal X) when the level-shifted AM signal (e.g., signal B) is less than the first output signal (e.g., signal X). Thus, the first output signal (e.g., signal X) generally corresponds to the peak minimum of the level-shifted AM signal (e.g., signal B). Similarly, maximum finding circuit 230 may be configured to increase an amplitude of a second output signal (e.g., signal Y) when the level-shifted AM signal (e.g., signal B) is greater than the second output signal (e.g., signal Y). Consequently, the second output signal (e.g., signal Y) generally corresponds to the peak maximum of the level-shifted AM signal (e.g., signal B). The outputs of the minimum finding circuit 230 and the maximum finding circuit 240 (e.g., signals X and Y, respectively) may be periodically equalized in response to one or more outputs of an equalizer 250. Equalizer 250 may be configured to generate one or more periodic equalization signals (e.g., signal EQ) for equalizing the amplitudes of the first and second output signals (e.g., signals X and Y, respectively). Generally, the amplitudes of signals X and Y are equalized to a midpoint amplitude as a result of the equalization signal being asserted by equalizer 250.

In one implementation, the equalizer 250 may include a timing element configured to provide a periodic timing signal. In one example, the timing element may be a clock circuit (e.g., a phase locked loop and frequency divider) or a crystal oscillator. In a preferred embodiment, the equalizer 250 may be configured to periodically equalize the amplitudes of the first output signal (e.g., signal X) and the second output signal (e.g., signal Y) at a rate of about ten or more times faster than the fastest modulation rate of the AM signal. For example, if the fastest modulation rate of the AM signal corresponds to a data width of 200 ms, equalizer 250 can be configured to periodically equalize the first and second output signals (e.g., signal X and Y, respectively) every 20 mS or less.

In one implementation, the receiver can include a coupling element (e.g., switch 255) configured to receive the equalization signal (e.g., signal EQ) and couple the first and second output signals (e.g., signals X and Y, respectively) in response thereto. Coupling element 255 can be configured to receive the equalization signal (e.g., signal EQ) from equalizer 250 and couple the output of the minimum finding circuit 230 to the output of the maximum finding circuit 240. In one implementation, coupling element 255 may include a CMOS transfer gate. Coupling element 255 preferably stays active (e.g., actively couples the outputs of the minimum and maximum finding circuits) for a short period of time relative to the period of the equalization signal (e.g., signal EQ). For example, the equalization signal (e.g., signal EQ) can have an active duty cycle of from 5% to 25% (and in one example, about 10%).

Figure 3B:
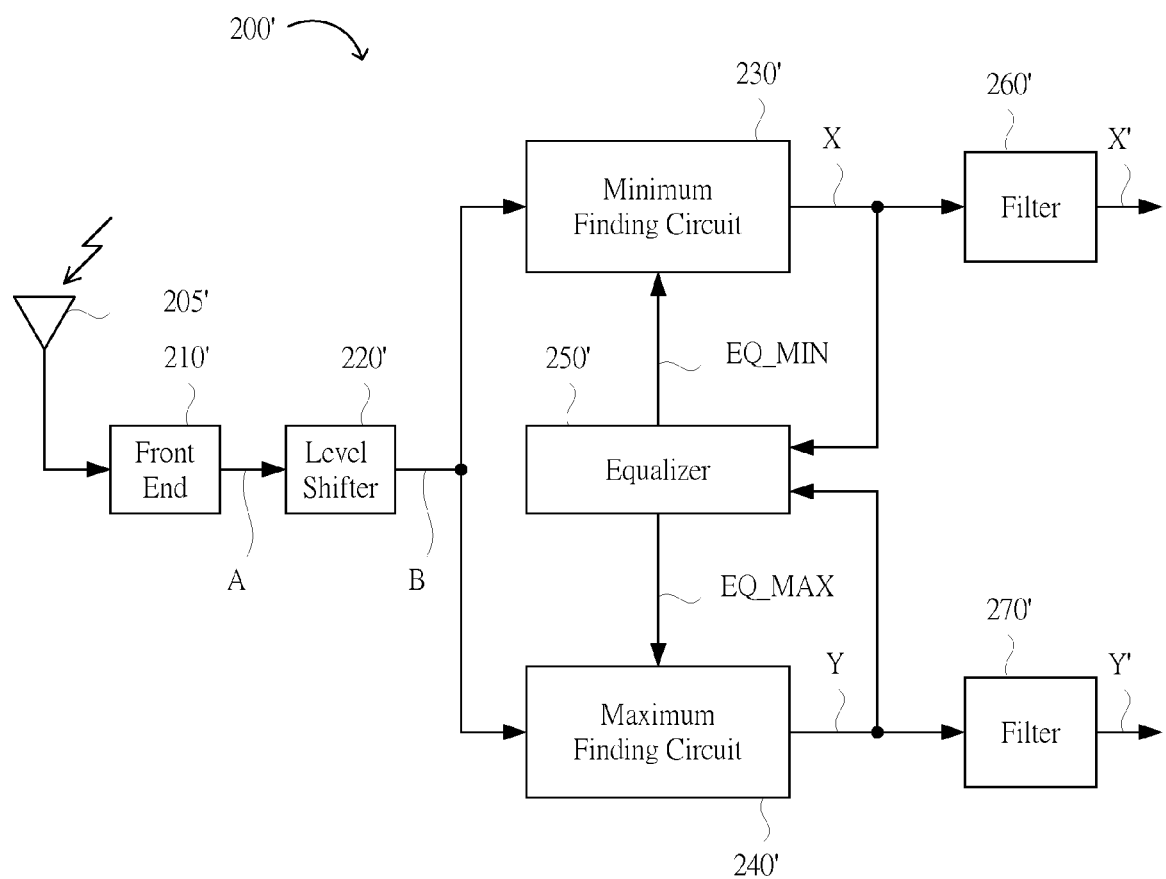

In another implementation, each of the first and second peak detectors (e.g., the minimum finding circuit and the maximum finding circuit) can be configured to receive one of a plurality of equalization signals. Referring now to FIG. 3B, an equalizer 250' can be configured to receive an output of the minimum finding circuit 230' (e.g., signal X) and an output of the maximum finding circuit 240' (e.g., signal Y), and generate a plurality of equalization signals (e.g., signals EQ_MIN and EQ_MAX). However, each of the plurality of equalization signals may be essentially the same signal, output on the same or different lines or busses.

In one implementation, each of the plurality of equalization signals can correspond to a midpoint amplitude of the first and second output signals. In another example, first and second equalization signals (e.g., signals EQ_MIN and EQ_MAX) may each correspond to an average value of the level-shifted AM signal (e.g., signal B). In yet another example, the first and second equalization signals may have a value corresponding to about one-half of the supply voltage (e.g., Vcc).

In one implementation, the receiver may include first and second filters coupled to the first and second peak detectors (e.g., the detector (e.g., the minimum and maximum finding circuits), respectively, configured to individually attenuate components of the first and the second output signals (e.g., signals X and Y, respectively) having a frequency greater than a threshold frequency. In one implementation, the threshold frequency may have a value corresponding to a rate at which the amplitude of the first and second output signals are periodically equalized. Referring back now to FIG. 3A, filter 260 and filter 270 may be configured to receive the first and second output signals (e.g., signals X and Y, respectively) and produce filtered output signals thereof (e.g., signals X' and Y'). For example, filters 260 and 270 may be low pass filters configured to suppress transient noise that may be introduced when equalizer 250 and coupling element 255 equalize signals X and Y. While the cutoff frequencies of such low pass filters are not critical, they are generally much less than the rate of equalization. For example, if equalizer 250 is configured to equalize at a frequency of 50 Hz (corresponding to a period of 20 mS), then filters 260 and 270 may individually have a cutoff frequency of less than 25 Hz.

The filtered output signals (e.g., signals X' and Y') correspond to the minimum and maximum peaks of the envelope of the level-shifted AM signal (e.g., signal B). In one implementation, a differential amplifier (not shown in FIG. 3B) may be configured to receive the first and second output signals and provide a third output signal representative of the difference between the first and the second output signals. The first and second output signals may be, e.g., signals X and Y, respectively, or a representation thereof such as filtered output signals X' and Y'. For example, the differential amplifier may be configured to subtract the output of the filter 260' (X') from the output of the filter 270' (Y') and produce an output signal representative of the envelope of the AM signal. Alternatively, referring back to FIG. 3A, the differential amplifier may be configured to subtract the output of the minimum finding circuit 230 from the output of the maximum finding circuit 240 and produce an output signal representative of the envelope of the AM signal.

Figure 4A:
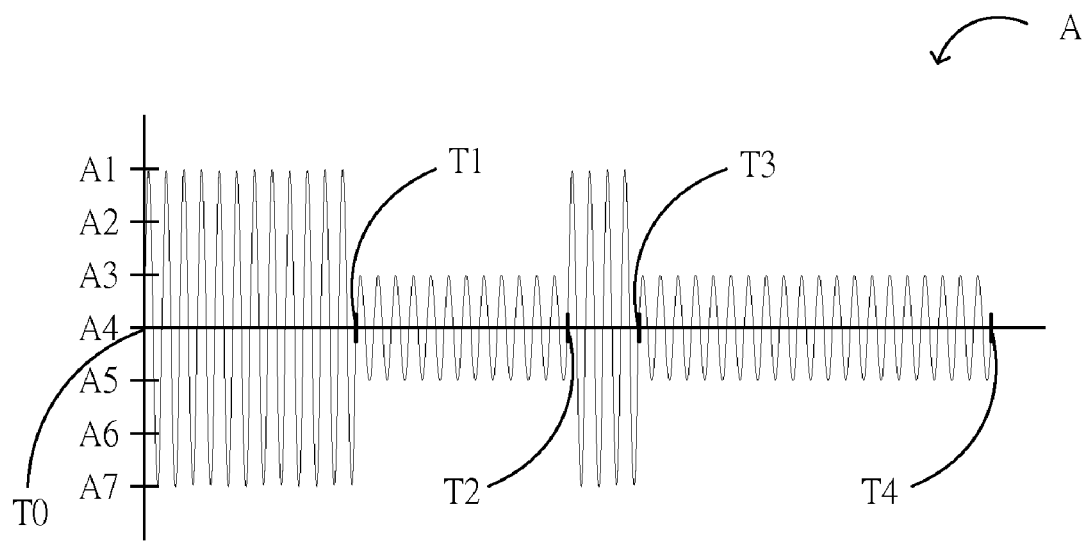
FIGS. 4A-4E are diagrams showing exemplary waveforms for signals at various nodes in the present envelope detector.

The invention can be further understood with reference to exemplary waveforms of signals at various nodes in the present envelope detector, as shown in FIGS. 4A-4E. Referring now to FIG. 4A, the AM signal (e.g., signal A) may be a fixed frequency sinusoidal signal, modulated by a digital signal and having a zero-DC offset (e.g., voltage level A4). In one example, the AM signal (e.g., signal A) may be similar to signal A of FIG. 3A and/or FIG. 3B. The AM signal (e.g., signal A) may be defined by maximum amplitude A1 and minimum amplitude A7 for a first period of time (i.e., the time between time markers T0 and T1) and by maximum amplitude A3 and minimum amplitude A5 for a second period of time (i.e., the time between time markers T1 and T2). In one example, amplitudes A1 and A7 may define a first digital value (e.g., a binary logic "1") and amplitudes A3 and A5 may define a second digital value (e.g., a binary logic "0"). In another example, and also as shown in FIG. 4A, the first and second digital values may be defined by one or more different modulated waveforms having common amplitudes, but different periods or duty cycles. For example, a first digital signal value (e.g., logic "1") may be defined by amplitudes A1 and A7 for a first period of time (i.e., the time between time markers T0 and T1) and amplitudes A3 and A5 for a second period of time (i.e., the time between time markers T1 and T2). A second digital signal value (e.g., logic "0") may be defined by amplitudes A1 and A7 for a third period of time different than the first period of time (i.e., the time between time markers T2 and T3) and amplitudes A3 and A5 for a fourth period of time different than the second period of time (i.e., the time between time markers T3 and T4). The sum of the first and second periods of time may equal the sum of the third and fourth periods of time.

In one embodiment, amplitudes A1, A3, A5, and A7 may correspond to 500 mV, 167 mV, −167 mV, and −500 mV, respectively. The time difference between time markers T0 and T1 may represent a minimum (or maximum) data width of the modulated digital signal (i.e., corresponding to the fastest modulation rate or a 50% duty cycle), for example, 200 mS, 500 mS, or 800 mS. Thus, for example, the difference between time markers T0 and T1 may be 500 mS, time markers T1 and T2 may be 500 mS, time markers T2 and T3 may be 200 mS, and time markers T3 and T4 may be 800 mS.

Figure 4B:
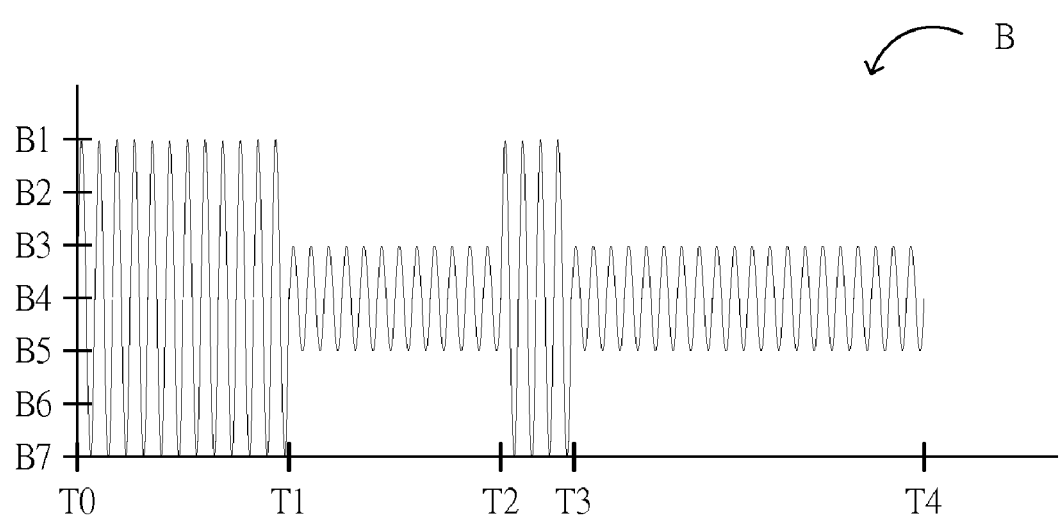

FIG. 4B shows a level-shifted version of the AM signal of FIG. 4A. In one example, the level-shifted AM signal may be a non-zero DC offset AM signal similar to signal B of FIG. 3A and/or FIG. 3B. In one example, the level-shifted AM signal (e.g., signal B) may be defined by maximum amplitude B1 and minimum amplitude B7 for a first period of time (i.e., the time between time markers T0 and T1) and by maximum amplitude B3 and minimum amplitude B5 for a second period of time (i.e., the time between time markers T1 and T2). In one example, amplitudes B1, B3, B5, and B7 may be 1000 mV, 667 mV, 333 mV and 0 mV, respectively.

Figure 4C:
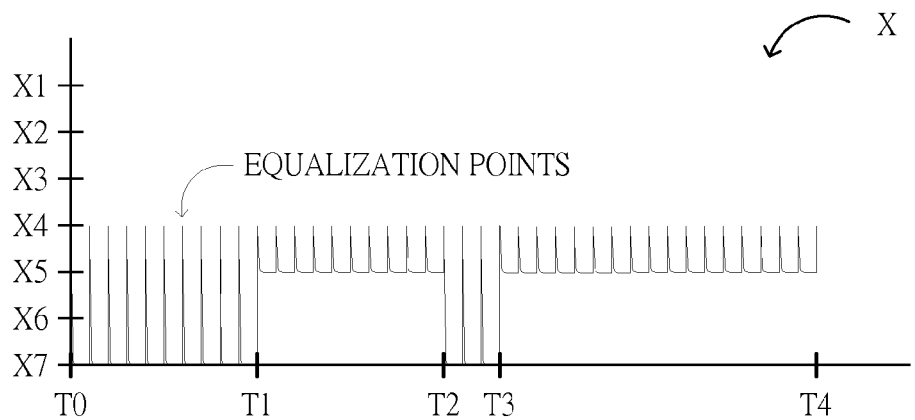
Figure 4D:
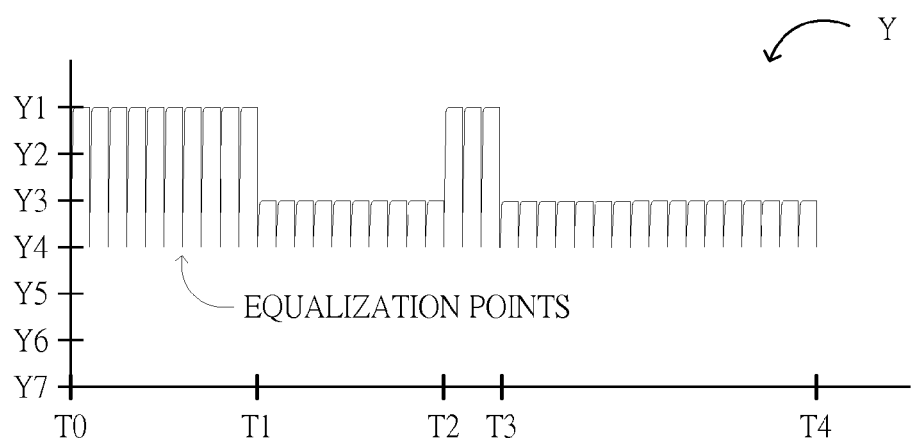

FIGS. 4C and 4D are together illustrative of the first and second output signals (e.g., signals X and Y, respectively, of FIG. 3A and/or FIG. 3B). In one example, they may correspond to maximum and minimum amplitude values of the level-shifted AM signal (e.g., signal B) of FIG. 4B. Referring now to FIG. 4C, the output of the minimum finding circuit (e.g., signal X) may be defined by amplitude X7 for a first period of time (i.e., the time between time markers T0 and T1) and by amplitude X5 for a second period of time (i.e., the time between time markers T1 and T2). Similarly, and referring now to FIG. 4D, the output of the maximum finding circuit (e.g., signal Y) can have an amplitude defined by amplitude Y1 for a first period of time (i.e., the time between time markers T0 and T1) and defined by amplitude Y3 for a second period of time (i.e., the time between time markers T1 and T2). Amplitudes X1 through X7 of FIG. 4C and Y1 through Y7 of FIG. 4D may be equal to each other and may further be equal to amplitudes B1 through B7 of FIG. 4B. For example, amplitudes X5 and X7 of FIG. 4C may be equal to 333 mV and 0 mV, respectively, and amplitudes Y1 and Y3 of FIG. 4D may be equal to 1000 mV and 667 mV, respectively. When the output signals of the minimum and maximum finding circuits are periodically equalized (as shown by the EQUALIZATION POINTS in FIGS. 4C and 4D), the first and second output signals are set equal to a midpoint amplitude, which may be the average of the first and second output signals (e.g., signals X and Y, respectively). As such, amplitudes X4 of FIG. 4C and Y4 of FIG. 4D may be equal to the numeric average of amplitudes X7 of FIG. 4C and Y1 of FIG. 4D. For example, if amplitude X7 of FIG. 4C is equal to 0 mV and amplitude Y1 of FIG. 4D is equal to 1000 mV, the midpoint amplitude X4 and/or Y4 can be equal to 500 mV.

Figure 4E:
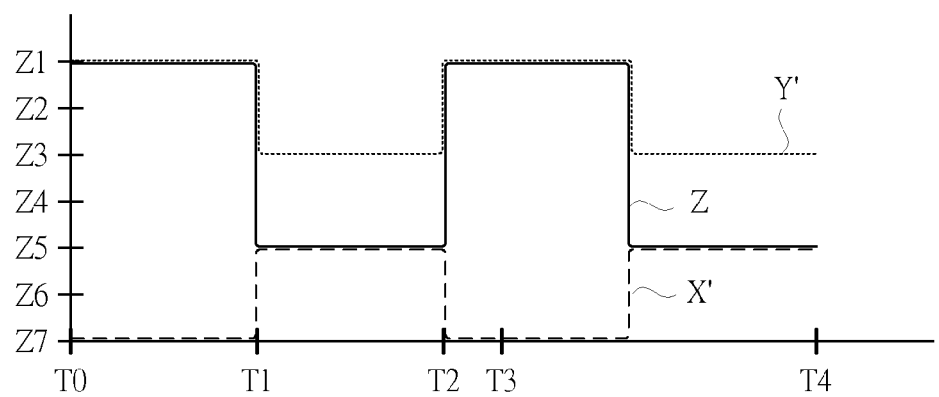

FIG. 4E is illustrative of the first and second filtered output signals (e.g., signals X' and Y', respectively, of FIG. 3A). In one example, signal X' may correspond to a low-pass filtered version of signal X of FIG. 4C (and thus the output of the minimum finding circuit 230 of FIG. 3A) and signal Y' may correspond to a low-pass filtered version of signal Y of FIG. 4D (and thus the output of the maximum finding circuit 240 of FIG. 3A). Further, signal Z can correspond to a difference between the filtered output signals (e.g., signals X' and Y'), such as may be provided by a differential amplifier receiving the filtered output signals as inputs thereto.

Exemplary Peak Detectors

Figure 5A:
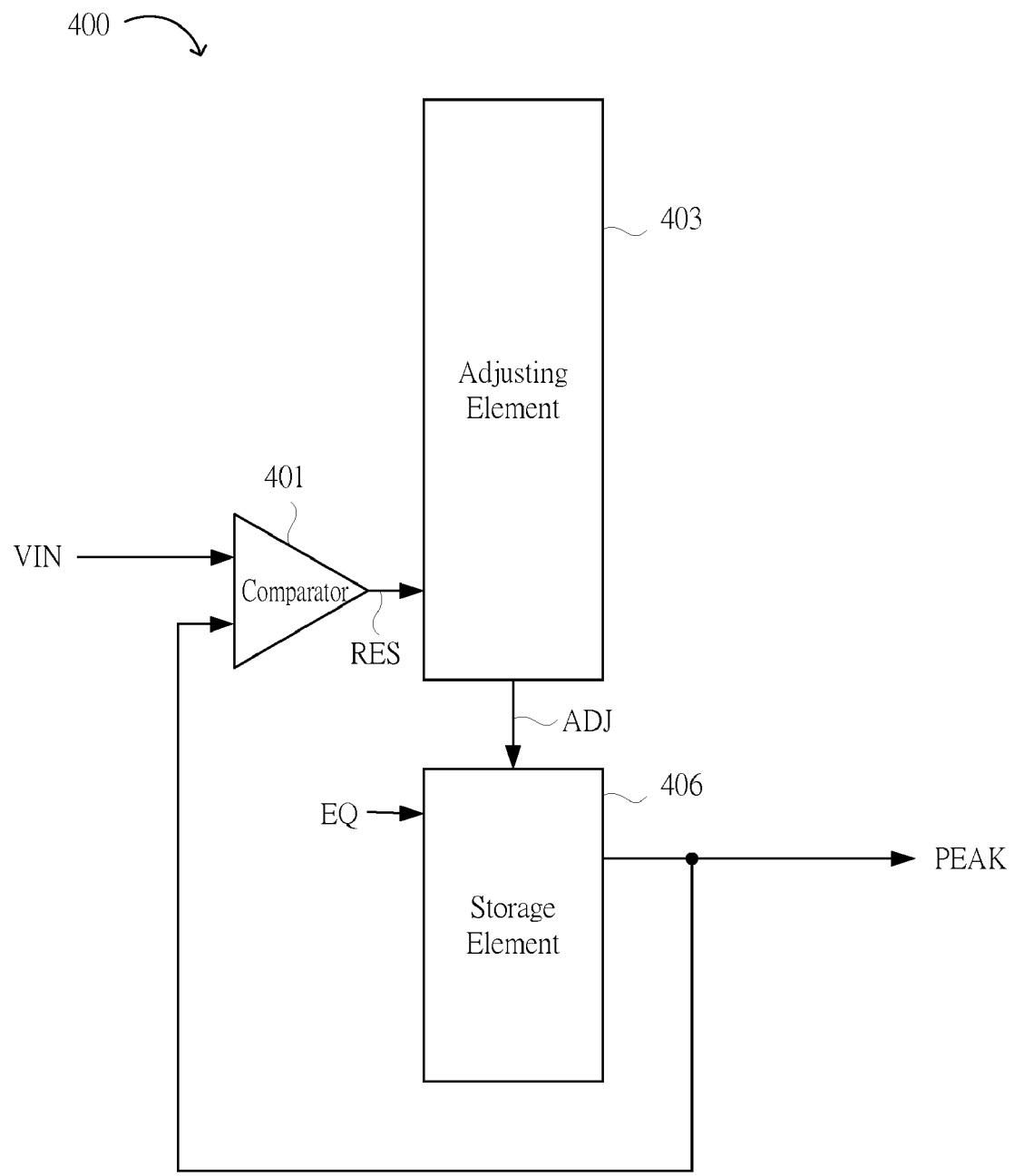
FIGS. 5A-5C are diagrams showing implementations of peak detectors suitable for use in the present invention.

Referring now to FIG. 5A, the first and second peak detectors (e.g., the minimum and maximum finding circuits of FIGS. 3A-3B) may each include a comparator 401 configured to receive a input (e.g., VIN) and a peak feedback signal (e.g., PEAK) and produce a resultant signal (e.g., RES) corresponding to the difference between the input (e.g., VIN) and the peak detector output signal (e.g., PEAK). An adjusting element 403 may be configured to receive the resultant signal (e.g., RES) and produce an adjustment signal (e.g., ADJ). Storage element 406 is generally configured to receive the adjustment signal (e.g., ADJ) and produce the peak detector output signal (e.g., PEAK). In one example, and corresponding to the receiver 200' of FIG. 3B, the storage element 406 can further be configured to receive an equalization signal (e.g., EQ).

Figure 5B:
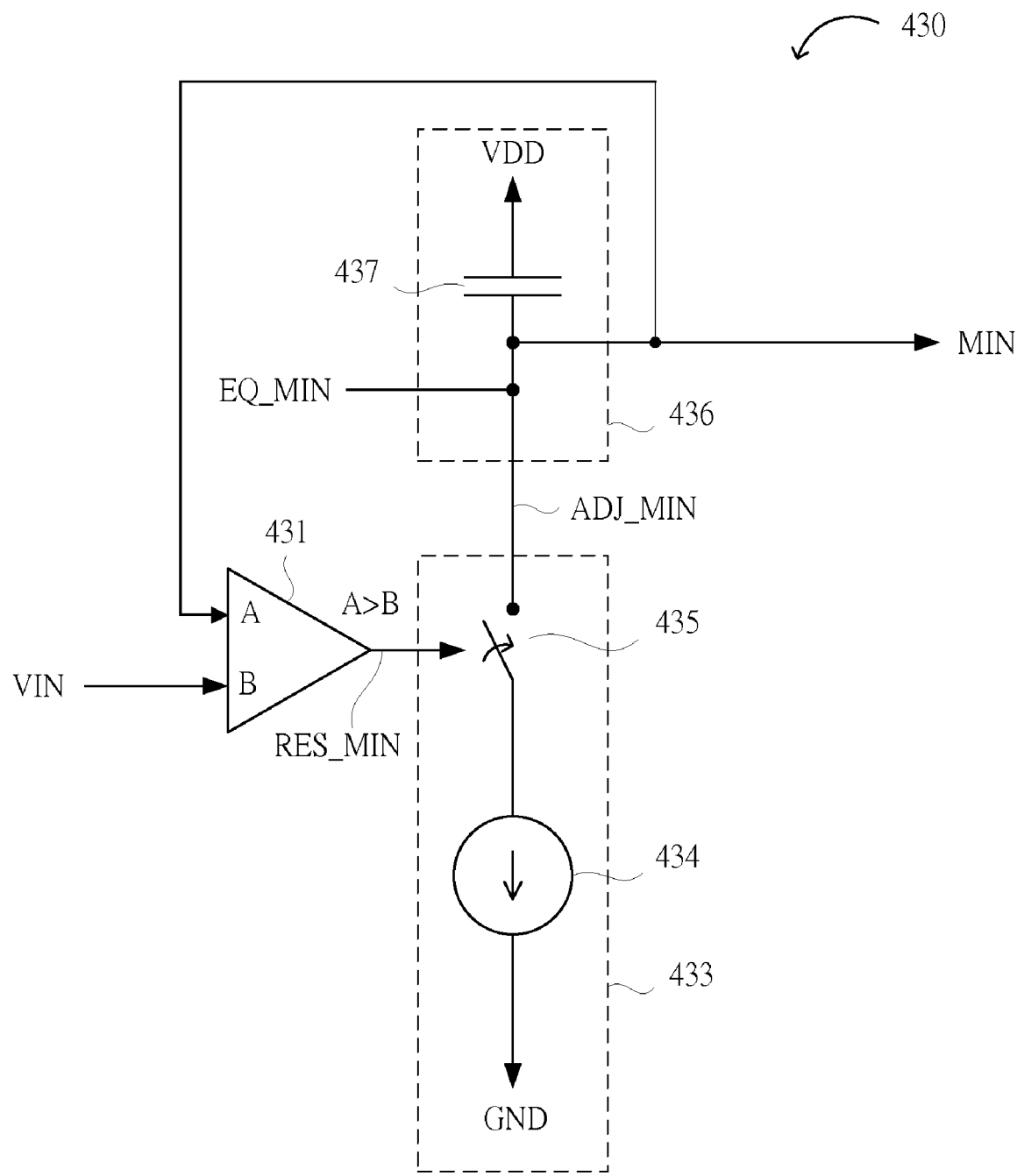

An exemplary minimum finding circuit is shown in FIG. 5B. In one implementation, the minimum finding circuit includes a comparator (e.g., 431) configured to receive the AM signal (e.g., VIN) and a feedback signal (e.g., MIN) and provide a resultant signal (e.g., RES_MIN) corresponding to a difference between the amplitude of the AM signal and the amplitude of the peak detector output signal (e.g., MIN), an adjusting element (e.g., 433) configured to receive the resultant signal and provide an adjustment signal (e.g., ADJ_MIN) for monotonically decreasing the amplitude of the output signal (e.g., MIN); and a storage element (e.g., 436) configured to receive the adjustment signal and provide the output signal.

In one example, the minimum finding circuit 430 includes a comparator 431 configured to receive the level-shifted AM signal (e.g., signal B of FIGS. 3A-3B) and the first output signal (e.g., signal X of FIGS. 3A-3B). The resultant output signal of comparator 431 (e.g., signal RES_MIN) is received by adjusting element 433 which may be configured to provide an adjustment signal (e.g., signal ADJ_MIN) to a storage element 436. In one implementation, the adjusting element 433 includes a CMOS current source 434 and a switch 435. The switch 435 may comprise an NMOS or PMOS FET transistor. The first storage element 436 can include a capacitor 437, although other storage elements are also contemplated. In another example, and corresponding to equalization circuit 250' of FIG. 3B, the first storage element 436 can also be configured to receive an equalization signal (e.g., signal EQ_MIN).

Figure 5C:
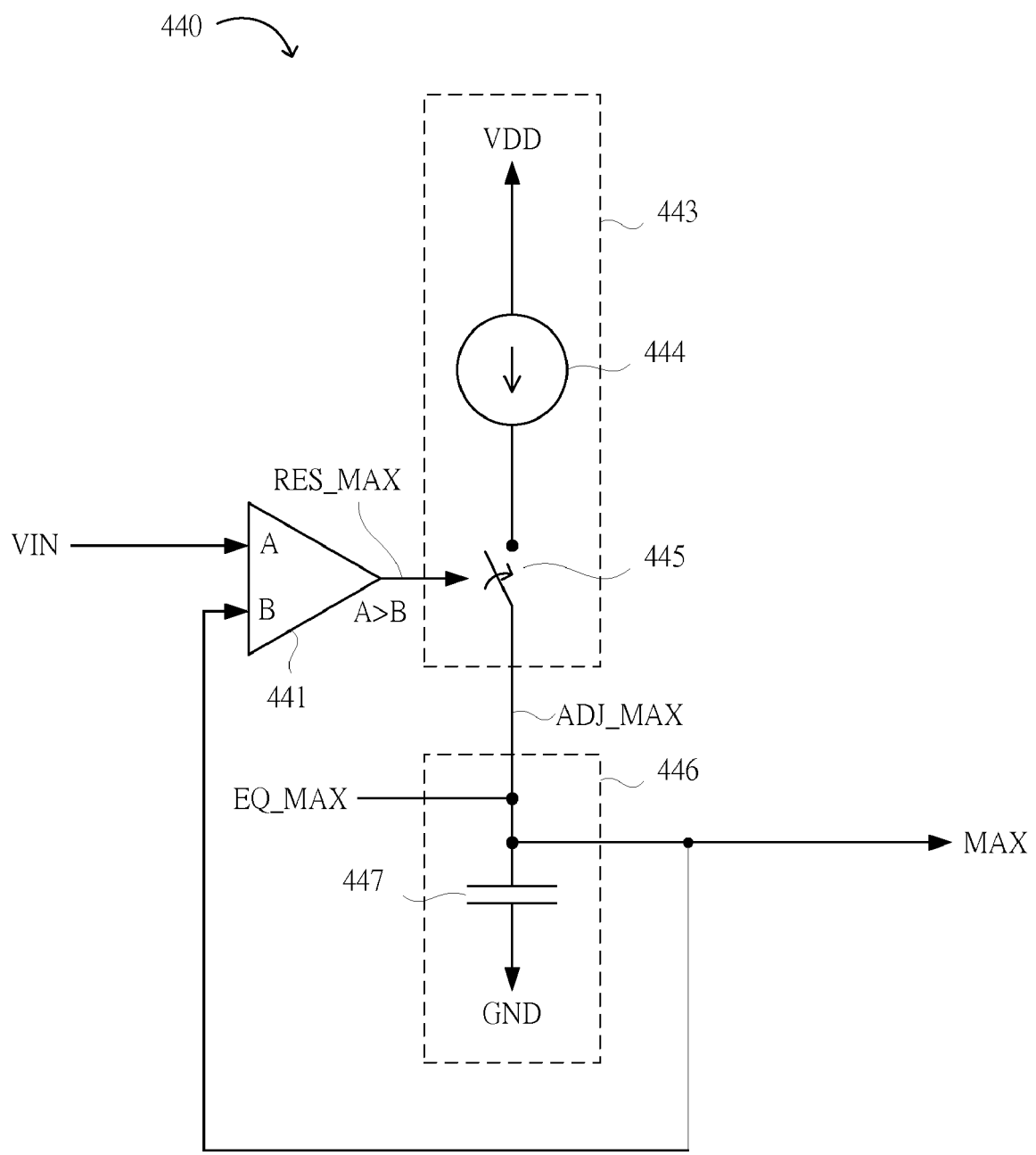

An exemplary maximum finding circuit is shown in FIG. 5C. In one implementation, the maximum finding circuit 440 includes a comparator (e.g., 441) configured to receive the AM signal (e.g., VIN) and a feedback signal (e.g., MAX) and provide a resultant signal (e.g., RES_MAX) corresponding to a difference between the amplitude of the AM signal and the amplitude of the output signal (e.g., MAX), an adjusting element (e.g., 443) configured to receive the resultant signal and provide an adjustment signal (e.g., ADJ_MAX) for monotonically increasing the amplitude of the output signal; and a storage element configured to receive the adjustment signal (e.g., ADJ_MAX) and provide the output signal.

In one example, the maximum finding circuit 440 includes a comparator 441 configured to receive the level-shifted AM signal (e.g., signal B of FIGS. 3A-3B) and the second output signal (e.g., signal Y of FIGS. 3A-3B). The resultant output signal of comparator 441 (e.g., signal RES_MAX) is received by adjusting element 443 which may be configured to provide an adjustment signal (e.g., signal ADJ_MAX) to a storage element 436. In one implementation, the second adjusting element 443 may include a CMOS current source 444 and a switch 445. The switch 445 may comprise an NMOS or PMOS FET transistor. The second storage element 446 can include a capacitor 447, although other storage elements are also contemplated. In another example, and corresponding to equalization circuit 250' of FIG. 3B, the second storage element 446 can also be configured to receive an equalization signal (e.g., signal EQ_MAX).

Figure 6:
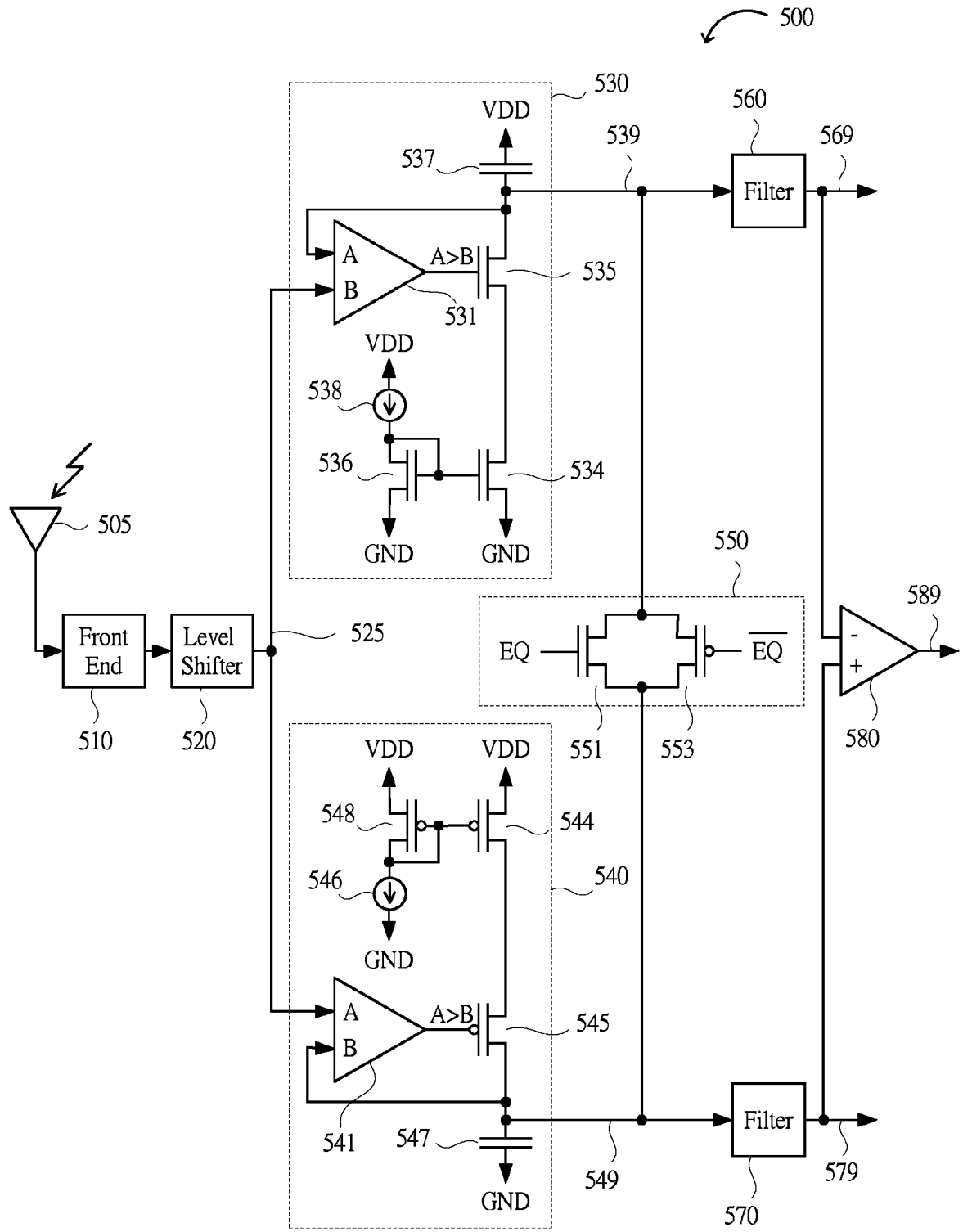
FIG. 6 is a diagram showing an exemplary implementation of an envelope detector in accordance with the present invention.

FIG. 6 shows an exemplary circuit diagram of an AM receiver in accordance with the present invention. Receiver 500 is generally configured to receive a digitally modulated, broadcast AM signal and produce a peak envelope minimum signal 569, a peak envelope maximum signal 579, and an envelope signal 589. In one example, the envelope signal 589 may correspond to the difference between the peak envelope minimum and maximum signals 569 and 579, respectively.

Antenna 505 may be coupled to front end 510, which may be further coupled to a level shifter 520. Front end 510 may be configured similarly to or the same as front end processor 110 of FIG. 2A or front end processor 110' of FIG. 2B. The output 525 of level shifter 520 may be a level-shifted version of the AM signal received by antenna 505. A first peak detector 530 may be configured to receive the level-shifted AM signal 525 and decrease an amplitude of a first output signal 539 when the amplitude of the level-shifted AM signal 525 is less than the amplitude of the first output signal 539. First detector 530 may include a comparator 531 configured to receive the level-shifted AM signal 525 and the first output signal 539. An nFET transistor 535 may be coupled to comparator 531, capacitor 537, and a current device (which may comprise nFET transistor 534, commonly controlled by a current mirror comprising nFET transistor 536 and current source 538).

Similarly, a second peak detector 540 may be configured to receive the level-shifted AM signal 525 and increase an amplitude of a second output signal 549 when the amplitude of the level-shifted AM signal 525 is greater than the amplitude of the second output signal 539. The second detector 540 may include a comparator 541 configured to receive the level shifted AM signal 525 and the second output signal 549. A pFET transistor 535 may be coupled to comparator 541, capacitor 547, and a current device (which may comprise pFET transistor 544, commonly controlled by a current mirror comprising pFET transistor 546 and current source 548).

An equalizer can be configured to produce one or more equalization signals EQ for periodically equalizing the amplitude of the first output signal 539 and the amplitude of the second output signal 549. In one example, the receiver 500 can include a coupling element 550, such as a CMOS transfer gate (including nFET transistor 551 and pFET transistor 553), coupled to the outputs of the first detector 530 and the second detector 540. Coupling element 550 may be configured to receive the equalization signal EQ (and in one example, the complement of EQ) and couple the outputs of the first detector 530 and the second detector 540 in response thereto.

Filter 560 may be configured to receive the first output signal 539 from the first detector 530 and produce a low-pass filtered version thereof 569. Similarly, filter 570 may be configured to receive the second output signal 539 from the first detector 530 and produce a low-pass filtered version thereof 579. Comparator 589 may be coupled to the first and the second filters 560 and 570 and produce an output signal 589 corresponding to the difference between the first filtered signal 569 and the second filtered signal 579.

In the foregoing exemplary descriptions, the first and second detectors, the equalization circuit, the filters, and the comparator are implemented in hardware components; alternatively, they may be implemented in software. For example, the broadcast AM signal may be received and digitized for processing in a software-defined radio. The level shifting, minimum detecting, maximum detecting, equalizing, filtering, and comparing circuits of FIG. 6 may all be realized in appropriate software algorithms by those skilled in the art.

An Exemplary Method of Receiving an Amplitude Modulated Signal

In another embodiment, a method of receiving an amplitude modulated (AM) signal can include decreasing an amplitude of a first output signal when an amplitude of the AM signal is less than the amplitude of the first output signal, increasing an amplitude of a second output signal when the amplitude of the AM signal is greater than the amplitude of the second output signal, and periodically and simultaneously increasing the amplitude of the first output signal and decreasing the amplitude of the second output signal (e.g., equalizing the first and second output signals).

In one example, and referring back to FIG. 3A, the first output signal may correspond to signal X and the second output signal may correspond to signal Y. Referring now to FIG. 5B, the amplitude of the first output signal (e.g., signal MIN) may be decreased when the amplitude of the AM signal (e.g., signal VIN) is less than the amplitude of the first output signal (e.g., signal MIN). In one implementation, the step of decreasing the amplitude of the first output signal may include storing a first amplitude of the first output signal, characterizing the amplitude of the AM signal as having a value relative to the first amplitude of the first output signal, and storing a second amplitude of the first output signal when the amplitude of the AM signal is less than the first amplitude of the first output signal.

For example, and still referring to FIG. 5B, the minimum peak value of the AM signal envelope (e.g., signal MIN, or referring to FIG. 4C, signal X) may be stored by a storage element (for example, a capacitor 437 in FIG. 5B). The amplitude of the level-shifted AM signal (e.g., signal VIN) may be continuously compared to the stored minimum peak value (e.g., signal MIN or X). If the amplitude of the level-shifted AM signal is less than the stored minimum peak value, then a new minimum peak value may be stored. The new (or second) minimum peak value is generally less than the original minimum peak value. In one implementation, the second minimum peak value is about equal to the amplitude of the (level-shifted) AM signal. For example, the minimum peak value (e.g., signal MIN or X) may be monotonically decreased until it has an amplitude about equal to that of the (level-shifted) AM signal (e.g., signal VIN).

In another example, the maximum peak value of the AM signal envelope (e.g., signal Y in FIG. 4D or MAX in FIG. 5C) may be increased when the amplitude of the AM signal (e.g., signal VIN) is greater than the maximum peak value (i.e., the amplitude of the second output signal). In one implementation, increasing the amplitude of the second output signal (e.g., the maximum peak signal) may include storing a first amplitude of the second output signal, characterizing the amplitude of the (level-shifted) AM signal as having a value relative to the first amplitude of the second output signal, and storing a second amplitude of the second output signal when the amplitude of the AM signal is greater than the first amplitude of the second output signal.

For example, the value of the maximum peak signal (e.g., signal MAX or Y) may be stored by a storage element (for example, capacitor 447 in FIG. 5C). The amplitude of the level-shifted AM signal (e.g., signal VIN) may be compared to the stored maximum peak value. If the amplitude of the level-shifted AM signal is greater than the stored maximum peak value, a new maximum peak amplitude may be stored. The new maximum peak amplitude generally has a value greater than that of the original maximum peak amplitude. In one implementation, the new maximum peak amplitude may be about equal to the maximum amplitude of the AM signal. For example, the second output signal (e.g., signal MAX)

may be monotonically increased until it has an amplitude equal to that of the (level-shifted) AM signal (e.g., signal VIN). Naturally, any description relating to the maximum peak signal also relates in a complementary way to the minimum peak signal, and vice versa.

In yet another example, and referring back to FIG. 3A, the amplitude of the first output signal (e.g., signal X) may be periodically increased and, simultaneously, the amplitude of the second output signal (e.g., signal Y) may be periodically decreased. In one implementation, the step of periodically and simultaneously adjusting the amplitudes of the first and second output signals may continue until the amplitudes of the first and second output signals are about equal. For example, the first and second output signals (e.g., signals X and Y, respectively) may be periodically coupled such that their amplitudes are both equalized to a midpoint amplitude (e.g., an average value of the minimum and maximum peak amplitudes). Equalizing the first and second output signals to a midpoint value effectively restarts the step of monotonically decreasing the first output signal (e.g., signal X) to find the minimum amplitude of the AM signal (e.g., signal A or B) and the step of monotonically increasing the second output signal (e.g., signal Y) to find the maximum amplitude of the AM signal (e.g., signal A or B).

By monotonically decreasing the first output signal (e.g., signal X), monotonically increasing the second output signal (e.g., signal Y), and periodically and simultaneously setting the first and second output signals (e.g., signals X and Y, respectively), the envelope of the AM signal (e.g., signal A or B) can be efficiently (and relatively continuously) detected and/or sampled. This enables a relatively fast, efficient and/or reliable mechanism for determining a transition from a first set of minimum and maximum amplitudes of the AM signal (e.g., 0 and 1 V, which may correspond to a "1" in binary logic) to a second set of minimum and maximum amplitudes (e.g., 0.333 and 0.667 V, which may correspond to a "0" in binary logic).

In one implementation, the step of periodically and simultaneously adjusting the amplitudes of the first and second output signals can occur at a rate about ten or more times faster than the fastest modulation rate of the AM signal. For example, if the modulation rate of the AM signal (e.g., signal A or B) is 1 Hz, the first and second outputs (e.g., signals X and Y, respectively) can be periodically and simultaneously set to a midpoint value at a rate of one thousand times per second (i.e., 1 kHz).

In another implementation, the method may further include filtering the first and second output signals, individually, to attenuate components of the first and the second output signals having a frequency component greater than a threshold frequency. The threshold frequency may correspond to (but is generally less than) the rate at which the amplitudes of the first and second output signals are periodically equalized. For example, and referring to FIGS. 3A-3B, the first output signal (e.g., signal X) may be filtered by a low pass filter to produce a first filtered output signal (e.g., signal X') and the second output signal (e.g., signal Y) may similarly be filtered by a low pass filter for producing a second filtered output signal (e.g., signal Y'). In another example, if the modulation rate of the AM signal (e.g., signal A or B) is 1 Hz and the rate of periodically adjusting the first and second output signals (e.g., signals X and Y, respectively) is 1 kHz, the cutoff frequencies of the first and second low pass filters may be 100 Hz. In yet another implementation, the method may further include subtracting the second output signal from the first output signal to produce a third output signal. For example, and referring now to FIG. 6, the first filtered output signal 569 may be subtracted from the second filtered output signal 579 to produce a third output signal 589. The third output signal 589 may correspond to the envelope of the AM signal 525.

An Exemplary Method of Detecting a Peak Amplitude of an Amplitude Modulated Signal Yet another embodiment of the present invention concerns a method of detecting a peak amplitude of an amplitude modulated (AM) signal. The method generally includes producing an output signal (e.g., a peak detector output signal) having a first amplitude, characterizing an amplitude of the AM signal as having a value relative to the first amplitude of the output signal, and monotonically adjusting the output signal to have a second amplitude, wherein a difference between the second amplitude and the AM signal amplitude is less than a difference between the first amplitude and the AM signal amplitude. In one implementation, the second amplitude of the output signal is about equal to the amplitude of the AM signal.

For example, and referring now to FIG. 5A, a peak detector output signal (e.g., signal PEAK) can have a first amplitude (see, e.g., FIGS. 4C-4D). The amplitude of the AM signal (e.g., signal VIN) can be characterized as having a value relative to the first peak detector output signal amplitude. When the AM signal amplitude is lower than the first amplitude (e.g., compare the AM signal between times T1 and T2 in FIG. 4B with the AM signal between times T0 and T1), the minimum peak detector output signal can thereafter be monotonically adjusted to have a second amplitude less than its first amplitude, and the maximum peak detector output signal can thereafter be monotonically adjusted to have a second amplitude greater than its first amplitude. Similarly, as a successive cycle of the AM signal is received, when the AM signal amplitude is higher than the second amplitude (e.g., compare the AM signal between times T2 and T3 in FIG. 4B with the AM signal between times T1 and T2), because the peak detector outputs are periodically equalized, the minimum peak detector output signal is adjusted to have a third amplitude greater than the second amplitude, and the maximum peak detector output signal is adjusted to have a third amplitude less than the second amplitude. Generally, the second and third amplitudes are about equal to the AM signal amplitude.

CONCLUSION/SUMMARY

Thus, the present invention provides efficient and economical receivers for, and methods of, receiving an amplitude modulated (AM) signal by monotonically detecting the peak minimum and peak maximum of the envelope of the AM signal.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A receiver for receiving an amplitude modulated (AM) signal, comprising:
   a) a first detector configured to receive said AM signal and decrease an amplitude of a first output signal when an amplitude of said AM signal is less than or about equal to said amplitude of said first output signal;
   b) a second detector configured to receive said AM signal and increase an amplitude of a second output signal when said amplitude of said AM signal is greater than or about equal to said amplitude of said second output signal; and
   c) an equalizer configured to produce one or more equalization signals for periodically equalizing said amplitude of said first output signal and said amplitude of said second output signal.

2. The receiver of claim 1, wherein said first detector comprises:
   a) a first comparator configured to receive said AM signal and said first output signal and provide a first resultant signal corresponding to a difference between said amplitude of said AM signal and said amplitude of said first output signal;
   b) a first adjusting element configured to receive said first resultant signal and to provide a first adjustment signal for monotonically decreasing said amplitude of said first output signal; and
   c) a first storage element configured to receive said first adjustment signal and to provide said first output signal.

3. The receiver of claim 2, wherein said first adjusting element comprises a CMOS current mirror and a FET transistor.

4. The receiver of claim 2, wherein said first storage element comprises a capacitor.

5. The receiver of claim 1, wherein said second detector comprises:
   a) a second comparator configured to receive said AM signal and said second output signal and provide a second resultant signal corresponding to a difference between said amplitude of said AM signal and said amplitude of said second output signal;
   b) a second adjusting element configured to receive said second resultant signal and to provide a second adjustment signal for monotonically increasing said amplitude of said second output signal; and
   c) a second storage element configured to receive said second adjustment signal and to provide said second output signal.

6. The receiver of claim 5, wherein said second adjusting element comprises a CMOS current mirror and a FET transistor.

7. The receiver of claim 5, wherein said second storage element comprises a capacitor.

8. The receiver of claim 1, further comprising a coupling element configured to receive said one or more equalization signals and to couple said first and said second output signals in response thereto.

9. The receiver of claim 8, wherein said coupling element comprises a CMOS transfer gate.

10. The receiver of claim 1, wherein said first detector is further configured to receive a first of said one or more equalization signals.

11. The receiver of claim 10, wherein said first of said one or more equalization signals corresponds to an average amplitude of said first and said second output signals.

12. The receiver of claim 1, wherein said second detector is further configured to receive a second of said one or more equalization signals.

13. The receiver of claim 12, wherein said second of said one or more equalization signals corresponds to an average amplitude of said first and said second output signals.

14. The receiver of claim 1, wherein said equalizer comprises a timing device configured to provide a periodic signal.

15. The receiver of claim 1, further comprising a level shifter configured to adjust an average value of said AM signal.

16. The receiver of claim 1, further comprising a first filter and a second filter coupled to said first detector and said second detector, respectively, and configured to individually attenuate components of said first and said second output signals having a frequency greater than a threshold frequency.

17. The receiver of claim 16, wherein said threshold frequency has a value corresponding to a rate at which said amplitude of said first output signal and said amplitude of said second output signal are periodically equalized.

18. The receiver of claim 1, further comprising a differential amplifier configured to receive said first and said second output signals and to provide a third output signal representative of the difference between said first and said second output signals.

19. The receiver of claim 1, wherein said equalizer is further configured to periodically equalize said amplitude of said first output signal and said amplitude of said second output signal at a rate of about ten or more times faster than a fastest modulation rate of said AM signal.

20. A method of receiving an amplitude modulated (AM) signal, comprising
   a) decreasing an amplitude of a first output signal when an amplitude of said AM signal is less than said amplitude of said first output signal;
   b) increasing an amplitude of a second output signal when said amplitude of said AM signal is greater than said amplitude of said second output signal; and
   c) periodically and simultaneously increasing said amplitude of said first output signal and decreasing said amplitude of said second output signal.

21. The method of claim 20, wherein said step of periodically and simultaneously increasing said amplitude of said first output signal and decreasing said amplitude of said second output signal continues until said amplitude of said first output signal is about equal to said amplitude of said second output signal.

22. The method of claim 20, wherein said step of periodically and simultaneously increasing said amplitude of said first output signal and decreasing said amplitude of said second output signal occurs at a rate of about ten or more times faster than a fastest modulation rate of said AM signal.

23. The method of claim 20, further comprising filtering said first and said second output signals, individually, to attenuate components of said first and said second output signals having a frequency component greater than a threshold frequency.

24. The method of claim 23, wherein said threshold frequency corresponds to a rate at which said amplitude of said first output signal is periodically increased and said amplitude of said second output signal is periodically decreased.

25. The method of claim 20, further comprising subtracting said first output signal from said second output signal to produce a third output signal.

26. The method of claim 20, wherein said step of decreasing said amplitude of said first output signal comprises:

a) storing a first amplitude of said first output signal;
b) characterizing said amplitude of said AM signal as having a value relative to said first amplitude of said first output signal; and
c) storing a second amplitude of said first output signal when said amplitude of said AM signal is less than said first amplitude of said first output signal, wherein said second amplitude of said first output signal is less than said first amplitude of said first output signal.

27. The method of claim 26, wherein said second amplitude of said first output signal is about equal to said amplitude of said AM signal.

28. The method of claim 20, wherein said step of increasing said amplitude of said second output signal comprises:

a) storing a first amplitude of said second output signal;
b) characterizing said amplitude of said AM signal as having a value relative to said first amplitude of said second output signal; and
c) storing a second amplitude of said second output signal when said amplitude of said AM signal is greater than said first amplitude of said second output signal, wherein said second amplitude of said second output signal is greater than said first amplitude of said second output signal.

29. The method of claim 28, wherein said second amplitude of said second output signal is about equal to said amplitude of said AM signal.

* * * * *